United States Patent [19]

Nguyen et al.

[11] Patent Number: 5,536,360
[45] Date of Patent: Jul. 16, 1996

[54] METHOD FOR ETCHING BORON NITRIDE

[75] Inventors: Son V. Nguyen; David M. Dobuzinsky, both of Hopewell Junction, N.Y.

[73] Assignee: International Business Machines Corporation, Armonk, N.Y.

[21] Appl. No.: 368,254

[22] Filed: Jan. 3, 1995

Related U.S. Application Data

[63] Continuation of Ser. No. 45,570, Apr. 9, 1993, abandoned.

[51] Int. Cl.$^6$ ................................................. H01L 21/3115
[52] U.S. Cl. ........................... 216/96; 437/236; 437/241; 148/DIG. 113
[58] Field of Search .................. 156/628; 148/DIG. 113

[56] References Cited

U.S. PATENT DOCUMENTS

| | | | |
|---|---|---|---|
| 3,785,891 | 1/1974 | Vrieze et al. | 156/3 |
| 4,057,895 | 11/1977 | Ghezzo | 29/591 |
| 4,293,373 | 10/1981 | Greenwood | 156/628 |
| 4,514,251 | 4/1985 | van Ommen et al. | 156/628 |
| 4,875,967 | 10/1989 | Mishima et al. | 148/DIG. 113 |
| 4,952,446 | 8/1990 | Lee et al. | 428/220 |
| 5,043,219 | 8/1991 | Yoshida et al. | 148/DIG. 113 |
| 5,217,567 | 6/1993 | Cote et al. | 156/657 |
| 5,227,318 | 7/1993 | Doll et al. | 148/DIG. 113 |

OTHER PUBLICATIONS

Wolf et al, "Silicon Processing for the VLSI Era"; vol. 1, 1986, pp. 532–534.

Ghandi, "VLSI Fabrication Principles", Silicon and Gallium Arsenide, 1983, pp. 495–497.

K. Shohno, et al., Surface Passivation CVD–BN Film Applied To Master Slice p–MOS IC, Extended Abstracts (vol. 79–2) of The Electrochemical Societ, Abstract No. 413, pp. 1046–1047 (1979).

Masahiko Maeda, et al., A Low–Permittivity Interconnection Using an SiBN Interlayer, IEEE Transactions on Electron Devices 36: 1610–1614 (1989).

Masahiko Maeda, et al., Low Dielectric Constant Amorphous SiBN Ternary Films Prepared by Plasma–Enhanced Deposition, Japanese Journal of Applied Physics 26: 660–665 (1987).

*Primary Examiner*—Brian E. Hearn
*Assistant Examiner*—Michael Trinh
*Attorney, Agent, or Firm*—Heslin & Rothenberg

[57] ABSTRACT

The subject invention provides a method of enhancing the etch rate of boron nitride which comprises doping a layer of boron nitride with an element from Group IVA of the Periodic Table of the Elements, such as silicon, carbon, or germanium. The doped boron nitride layer can be wet etched at a faster rate with hot phosphoric acid than was possible prior to doping the boron nitride.

4 Claims, No Drawings

METHOD FOR ETCHING BORON NITRIDE

This application is a continuation of application Ser. No. 08/045,570, filed Apr. 4, 1993, now abandoned.

TECHNICAL FIELD

This invention relates to a method for etching boron nitride, and more particularly to a method of enhancing the etch rate of boron nitride. This is accomplished by doping the boron nitride with a silicon, carbon, or germanium, for example and wet etching with phosphoric acid.

BACKGROUND ART

In the field of semiconductor device fabrication, it is common to utilize insulation layers to separate conductive layers. Silicon nitride layers applied by plasma-enhanced chemical vapor deposition (PECVD) have been used as such inter-layer insulation films. These silicon nitride films have good insulation characteristics as well as high blocking effects against moisture and alkali metal ions. In addition, silicon nitride insulation layers exhibit conformal step coverage and high cracking resistance characteristics. See M. Maeda and T. Makino, Japanese Journal of Applied Physics 26:660–665 (1987).

However, there are some drawbacks to silicon nitride insulation layers. Such drawbacks include a relatively high dielectric constant compared with phosphorous-silicate glass (PSG) and silicon dioxide insulation layers, leading to relatively large parasitic capacitance and relatively long propagation delay times between devices. See M. Maeda and T. Makino.

A need for other dielectric or insulation film materials with low dielectric constants, conformal step coverage characteristics, good insulation characteristics, and high cracking resistance thus continued to exist. In response to this need, boron nitride films prepared by atmospheric chemical vapor deposition (CVD) or PECVD were devised. These boron nitride films were highly insulating, chemically inert, and thermally stable. The films also exhibit a low dielectric constant.

However, in order to be useful the boron nitride films must be compatible with current semiconductor device fabrication processes. Therefore, suitable etching techniques must be available.

Wet etching processes are common in semiconductor device fabrication processes. Common wet etchants include hydrofluoric acid (HF), buffered hydrofluoric acid (BHF), and hot phosphoric acid, for example. These etchants show little ability to etch boron nitride, and therefore current fabrication processes are not compatible with the use of boron nitride insulation layers.

A need thus exists for a method of etching boron nitride using conventional etchants so that boron nitride can be used in the fabrication of semiconductor devices. The ability to etch boron nitride will allow the material to be utilized, and allow one to take advantage of its favorable insulation layer characteristics.

DISCLOSURE OF THE INVENTION

It is thus an object of the subject invention to provide a method of etching boron nitride. The method must be compatible with current semiconductor fabrication processes.

Briefly described, the present invention comprises a method for etching boron nitride. This is accomplished by doping the layer of boron nitride with an element selected from Group IVA of the Periodic Table of the Elements. Group IVA includes silicon, carbon, germanium, tin and lead. Each of these elements has a structure similar to boron nitride, and the resulting doped boron nitride is slightly more amorphous while keeping the same hexagonal bonding structure. After the boron nitride layer is doped it can be etched using etchants based on phosphoric acid.

The level of doping can be used to control the etch rate of the boron nitride. Generally, a small amount of the dopant is utilized, ranging up to about twenty (20) percent without otherwise detracting from the boron nitride film's physical properties. A range of about two (2) to about ten (10) percent is preferred.

The doping of the boron nitride thus enhances the ability to etch the boron nitride using conventional wet etchant techniques. This allows the boron nitride to be utilized as an insulation layer in semiconductor devices and allows one to take advantage of the insulation characteristics of the boron nitride.

BEST MODE FOR CARRYING OUT THE INVENTION

As described above, the broad concept of the subject invention is directed to a method for etching boron nitride. A layer of boron nitride is doped with an element selected from Group IVA of the Periodic Table of the Elements, such as silicon, carbon, or germanium. The doped layer of boron nitride is then etched, using suitable etchants such as hot phosphoric acid at about 165° C. Generally, the amount of dopant can range up to about twenty (20) percent by atomic composition, preferably about two (2) to about ten (10) percent by atomic composition. These low concentrations of dopant do not adversely affect the boron nitride characteristics as an insulation layer. The amount of dopant can be altered to control the etch rate of the boron nitride.

In one embodiment, PECVD boron nitride films were deposited and doped in a suitable reactor under the following conditions:

| AME5000 Reactor System (Silane Gas Distribution Blocker) | | |
|---|---|---|
| Pressure: | 4.4 Torrs | |
| Temperature: | 400° C. | |
| Electrode Spacing: | 1.0 cm | |
| Power Density: | 2.0 w/cm$^2$ | |
| Gases Flow Rates: | Nitrogen | 2,000–20,000 sccm |
| | $B_2H_6$ (1% in $N_2$) | 1,000 sccm |
| | $NH_3$ | 0–70 sccm |
| | $SiH_4$ (for $Si_xBN$) | 1–5 sccm |
| Uniformity (6 Sigma) | <5–10% | |
| Deposition Rate (nm/min) | 100 (for BN) | |
| | 100–140 (for $Si_xBN$) | |
| Refractive Index | 1.75–1.8 (for BN and $Si_xBN$) | |

As indicated, a small amount of silane ($SiH_4$) is added to form the low silicon doped (<5 atomic %) boron nitride film. The film has excellent thickness uniformity and stability toward water vapor. X-ray Photoelectron Spectroscopic (XPS) analysis shows that films deposited with 5 sccm flow have less than 5 atomic % silicon content distributed uniformly through the depth thickness. Films deposited with 1–4 sccm $SiH_4$ have less than 5 atomic % silicon doping in the film's bulk. Fourier Transform Infrared (FTIR) and Transmission Electron Microscopy (TEM) analysis shows that films deposited with low silicon doping become more amorphous although they still have the same hexagonal bonding structure. Boron nitride (BN) and low silicon doped BN (SiBN) films are etched in hot phosphoric acid (165° C.) and low pressure chemical vapor deposition (LPCVD) silicon nitride film was used as a reference.

Table 1 shows the etch rate and etch selectivity of boron nitride, low silicon doped boron nitride, and LPCVD silicon nitride films etched in hot phosphoric acid. It can be seen that low level silane doping (2–5 sccm $SiH_4$, i.e. less than 5 atomic % Si content) enhances the etch rate to more than three (3) orders of magnitude. The etch rate is also significantly higher than those of LPCVD silicon nitride, thus making the use of boron nitride more practical as an insulation layer.

The enhanced etch rate of low silicon doped boron nitride is probably due to the more amorphous characteristic of low doped $Si_xBN$ compared to BN. At low doped (<5 atomic %), no significant change in dry etching behavior is observed and only a small change in the BN properties occur since the hexagonal bonding still exists.

Low levels of doping by carbon or germanium using $CH_4$ or $GeH_4$ as reactant gases will result in similar etch rate enhancement of the boron nitride since the doped BN will also become slightly more amorphous while keeping the same hexagonal bonding structure. Other Group IVA elements can also be utilized with similar results.

TABLE 1

Etch Rate and Selectivity vs. Silane Flow in Hot $H_3PO_4$ (165° C.)

| Films | $SiH_4$ Flow (sccm) | Etch Rate (nm/hr) | Sel. to BN |
|---|---|---|---|
| BN | 0 | 5 | — |
| $Si_xBN$ | 1 | 162 | 32 |
| $Si_xBN$ | 2 | 5214 | 1043 |
| $Si_xBN$ | 3 | 6798 | 1360 |
| $Si_xBN$ | 4 | 7800 | 1560 |
| $Si_xBN$ | 5 | 10782 | 2156 |
| LPCVD Nitride | — | 228 | 45 |

The chemical composition of the $Si_xBN$ films referred to above were as follows: (in relative atomic percent)

| Films | Silane sccm | Silicon Atomic % | Boron % | Nitrogen % |
|---|---|---|---|---|
| $Si_xBN$ | 1 | 3.6 | 44.8 | 50.8 |
| $Si_xBN$ | 2 | 6.7 | 43.6 | 49.4 |
| $Si_xBN$ | 3 | 10.1 | 39.1 | 49.7 |
| $Si_xBN$ | 4 | 12.5 | 33.2 | 53.8 |
| $Si_xBN$ | 5 | 16.0 | 37.2 | 46.3 |
| BN | 0 | 0 | 53.3 | 46.5 |

The principles of this invention should also be extendable to other compounds made up of Group IIIA and Group VA elements. For example, boron phosphide should exhibit similar insulation and etching characteristics to boron nitride when doped with a Group IVA element such as silicon.

While the invention has been particularly shown and described with reference to preferred embodiments thereof, it will be understood by those skilled in the art that various changes in form and details may be made therein without departing from the spirit and scope of the invention.

What is claimed is:

1. In a method of wet etching boron nitride with phosphoric acid, the improvement comprising increasing the wet etch rate of said boron nitride with phosphoric acid by doping said boron nitride with up to 20 percent, by atomic composition, of an element selected from the group consisting of silicon, carbon, and germanium.

2. A method for wet etching boron nitride comprising:

(a) doping said boron nitride with up to 20 atom percent of an element chosen from the group consisting of carbon, silicon and germanium; and (b) exposing said boron nitride to phosphoric acid.

3. The method of claim 1 wherein said phosphoric acid is at a temperature of about 165° C.

4. The method of claim 1 wherein said boron nitride is doped with said element at 2 to 10 percent by atomic composition.

* * * * *